US009558887B2

(12) United States Patent
Majumder et al.

(10) Patent No.: US 9,558,887 B2
(45) Date of Patent: Jan. 31, 2017

(54) FORMING CONDUCTIVE PORTIONS IN INSULATING MATERIALS MATREIALS USING AN ION BEAM

(71) Applicant: Monash University, Clayton, Victoria (AU)

(72) Inventors: Mainak Majumder, Clayton (AU); Jing Fu, Clayton (AU); Derrek E Lobo, Clayton (AU)

(73) Assignee: MONASH UNIVERSITY, Clayton, Victoria (AU)

( * ) Notice: Subject to any disclaimer, the term of this patent is extended or adjusted under 35 U.S.C. 154(b) by 145 days.

(21) Appl. No.: 14/408,899

(22) PCT Filed: Jun. 21, 2013

(86) PCT No.: PCT/AU2013/000668
§ 371 (c)(1),
(2) Date: Dec. 17, 2014

(87) PCT Pub. No.: WO2013/188924
PCT Pub. Date: Dec. 27, 2013

(65) Prior Publication Data
US 2015/0179342 A1     Jun. 25, 2015

(30) Foreign Application Priority Data

Jun. 21, 2012   (AU) .............................. 2012902606

(51) Int. Cl.
*H01L 21/768* (2006.01)
*H01G 4/14* (2006.01)
(Continued)

(52) U.S. Cl.
CPC ................. *H01G 4/14* (2013.01); *B32B 9/007* (2013.01); *B32B 9/04* (2013.01); *C01B 31/0484* (2013.01);
(Continued)

(58) Field of Classification Search
CPC ................... H01L 21/76823; H01L 21/76838; H01L 23/53276
See application file for complete search history.

(56) References Cited

U.S. PATENT DOCUMENTS

| | | | |
|---|---|---|---|
| 5,096,882 A | 3/1992 | Kato et al. | |
| 7,071,258 B1 * | 7/2006 | Jang ...................... | B82Y 30/00 423/445 B |

(Continued)

FOREIGN PATENT DOCUMENTS

| | | |
|---|---|---|
| KR | 101033955 B1 | 5/2011 |
| WO | 2009158552 A1 | 12/2009 |
| WO | 2010003600 A1 | 1/2010 |

OTHER PUBLICATIONS

Bakarat M. et al., "Reduction of Graphene Oxide by Electron Beam Generated Plasmas Produced in Methane/Argon Mixtures" Carbon, 2010, vol. 48, issue 12, p. 3382-3390.
(Continued)

*Primary Examiner* — Thanh V Pham
(74) *Attorney, Agent, or Firm* — David D. Brush; Westman, Champlin & Koehler, P.A.

(57) ABSTRACT

A method of forming a conductive portion in an insulating material. The insulating material includes carbon and at least one other constituent. The method includes exposing the insulating material to ions to preferentially remove the other constituent.

22 Claims, 4 Drawing Sheets

(51) Int. Cl.
| | |
|---|---|
| B32B 9/04 | (2006.01) |
| H01L 21/02 | (2006.01) |
| H01L 23/532 | (2006.01) |
| H01G 11/36 | (2013.01) |
| H01G 11/86 | (2013.01) |
| B32B 9/00 | (2006.01) |
| C01B 31/04 | (2006.01) |
| H01B 1/24 | (2006.01) |
| H01B 3/00 | (2006.01) |
| B82Y 30/00 | (2011.01) |
| B82Y 40/00 | (2011.01) |

(52) U.S. Cl.
CPC .............. *H01B 1/24* (2013.01); *H01B 3/004* (2013.01); *H01G 11/36* (2013.01); *H01G 11/86* (2013.01); *H01L 21/02115* (2013.01); *H01L 21/76823* (2013.01); *H01L 21/76838* (2013.01); *H01L 23/53276* (2013.01); *B32B 2307/206* (2013.01); *B82Y 30/00* (2013.01); *B82Y 40/00* (2013.01); *H01L 2924/0002* (2013.01); *Y02E 60/13* (2013.01); *Y10T 29/417* (2015.01); *Y10T 29/49117* (2015.01)

(56) References Cited

U.S. PATENT DOCUMENTS

| | | | |
|---|---|---|---|
| 2008/0089829 A1 | 4/2008 | Ganapathiraman et al. | |
| 2009/0324897 A1 | 12/2009 | Choi et al. | |
| 2012/0205606 A1* | 8/2012 | Lee | H01L 45/04 257/2 |
| 2015/0262736 A1* | 9/2015 | Liu | C23C 18/1241 29/825 |

OTHER PUBLICATIONS

Extended European Search Report dated Mar. 11, 2016 for corresponding European Application No. 13807539.
Bunch, J.S. et al: "Coulomb Oscillations and Hall Effect in Quasi-2D Graphite Quantum Dots", Nano Letters 2005 (Jan. 8, 2005), vol. 5, No. 2, pp. 287-290.
Westervilt, R.M.: "Graphene Nanoelectronics", Science 2008 (Apr. 18, 2008), vol. 320, pp. 324-325.
Dimiev, A. et al: "Layer-by-Layer Removal of Graphene for Device Patterning", Science 2011 (Mar. 4, 2011), vol. 331, pp. 1168-1172.
Wang, Q. H. et al: "Characterization and nanopatterning of organically functionalized graphene with ultrahigh vacuum scanning tunneling microscopy", MRS Bulletin 2011, vol. 36, pp. 532-542.
Byun, I.-S. et al: "Nanoscale Lithography on Monolayer Graphene Using Hydrogenation and Oxidation", ACS Nano 2011, vol. 5, No. 8, pp. 6417-6424.
Zhang, Y. et al: "Direct imprinting of microcircuits on graphene oxides film by femtosecond laser reduction", Nano Today 2010, vol. 4, pp. 15-20.
Wei, Z. et al: "Nanoscale Tunable Reduction of Graphene Oxide for Graphene Electronics", Science 2010 (Jun. 11, 2010), vol. 328, pp. 1373-1376.
Chen, J. et al: "Surface amorphization and deoxygenation of graphene oxide paper by Ti ion implementation", Carbon 2011, vol. 49, pp. 3141-3147.
International Search Report dated Sep. 5, 2013 for corresponding International Application No. PCT/AU2013/000668, filed Jun. 21, 2013.
Written Opinion dated Sep. 5, 2013 for corresponding International Application No. PCT/AU2013/000668, filed Jun. 21, 2013.

* cited by examiner

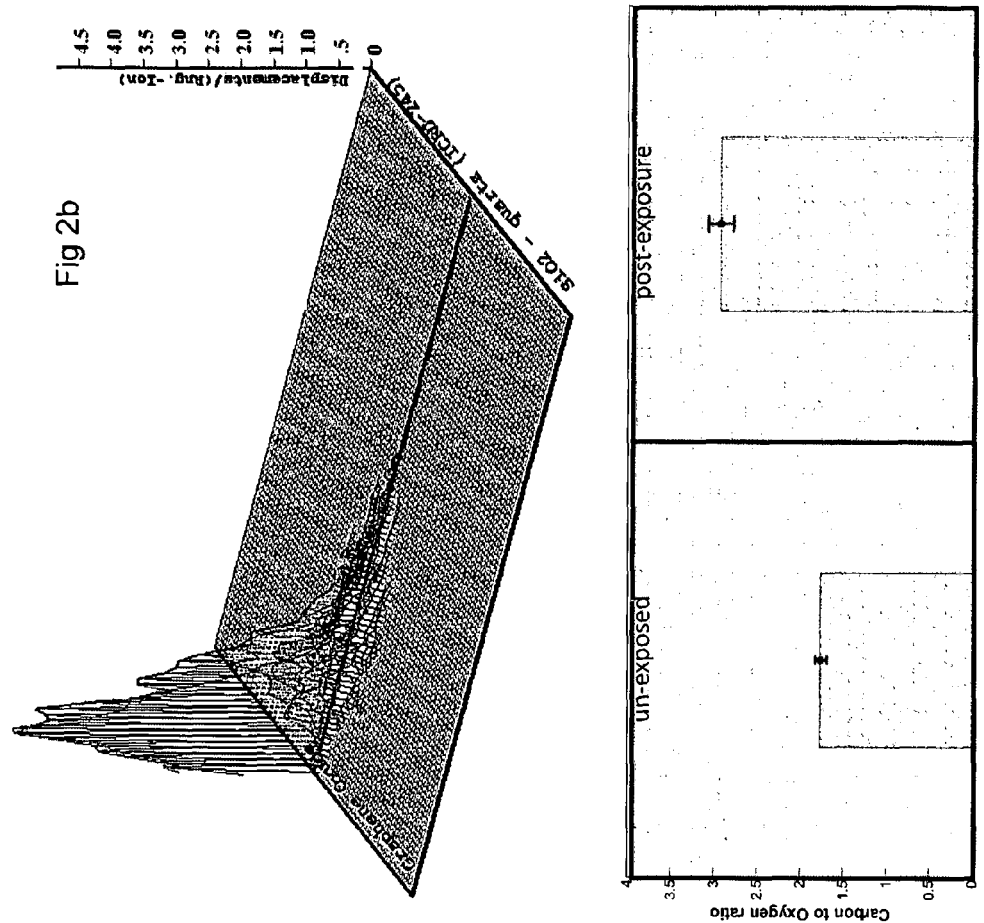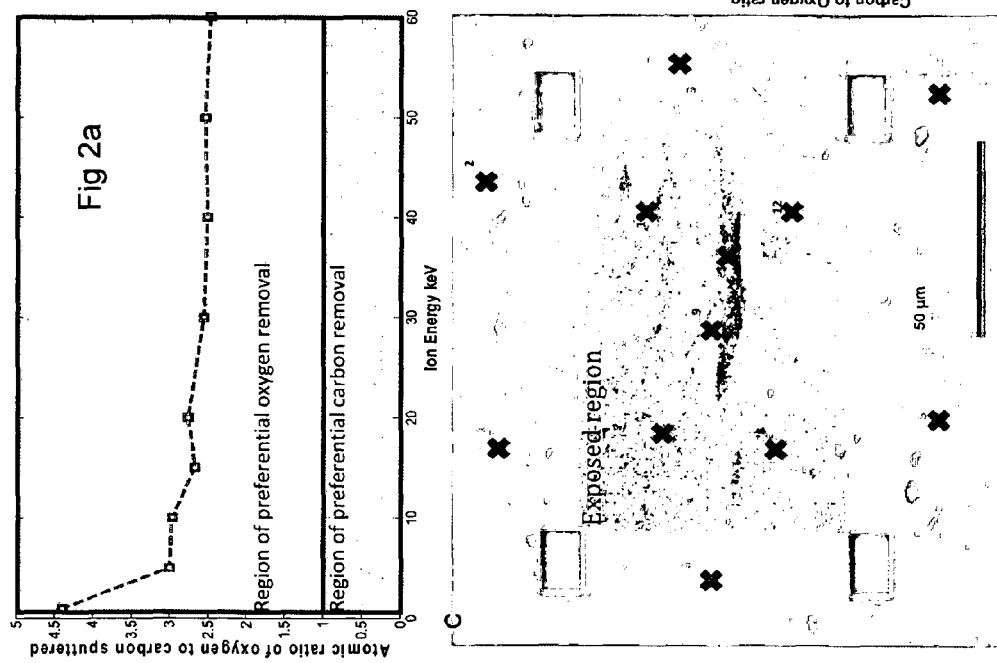

Fig 3a
Fig 3b
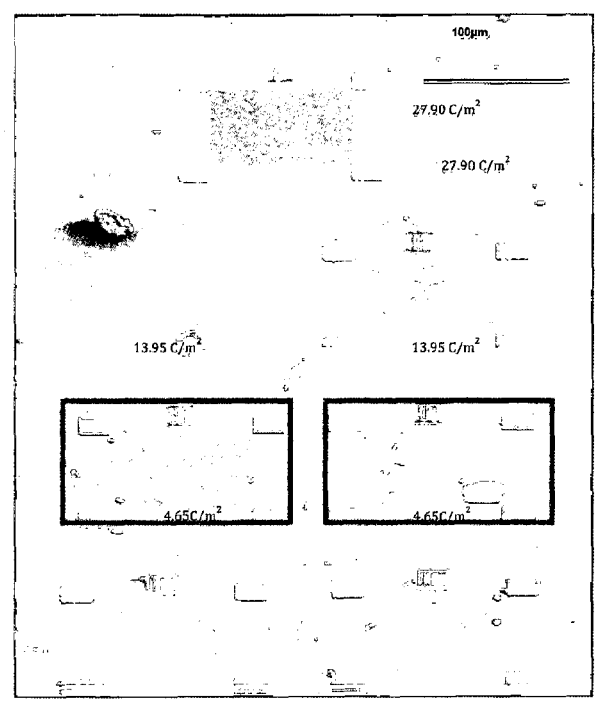
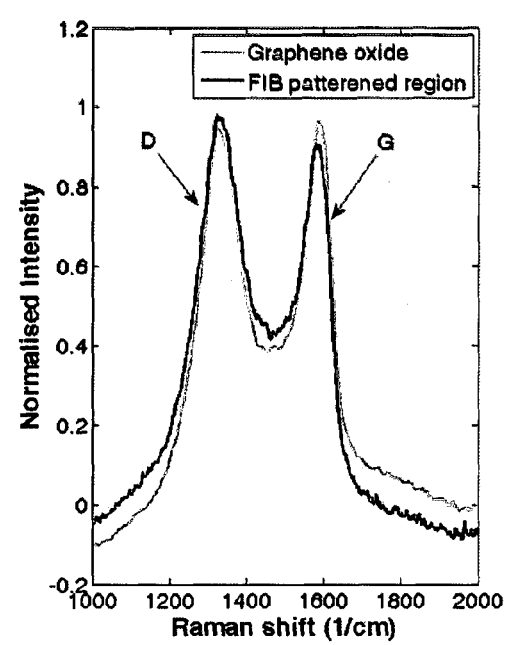
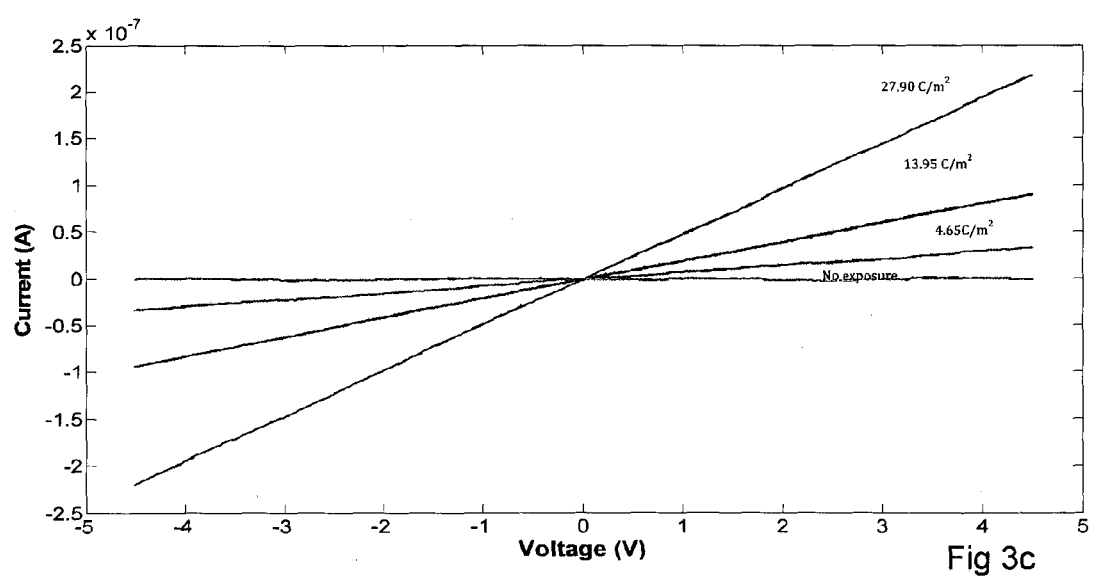
Fig 3c

Fig 4a
Fig 4b
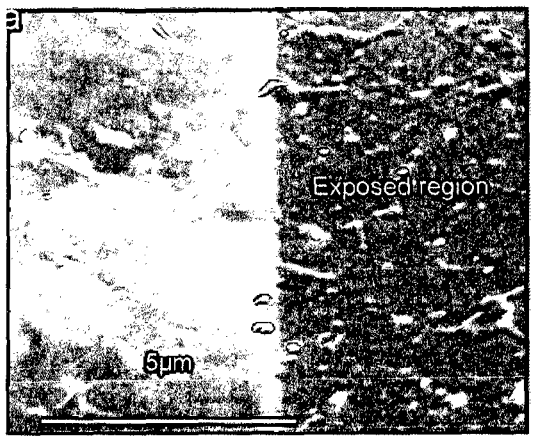
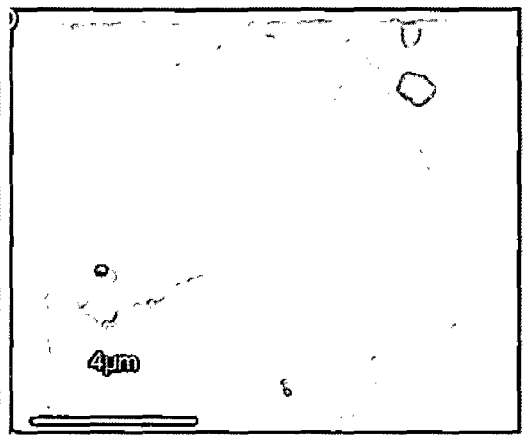
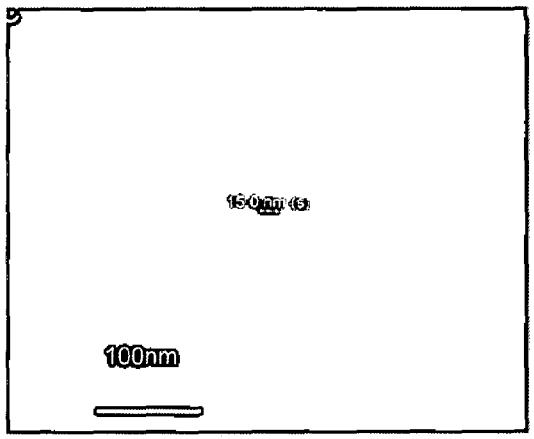
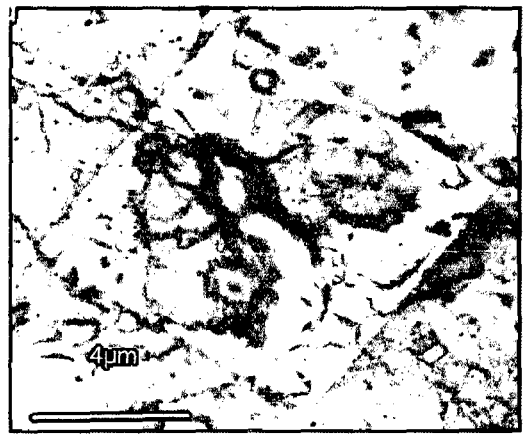
Fig 4c
Fig 4d

FORMING CONDUCTIVE PORTIONS IN INSULATING MATERIALS MATREIALS USING AN ION BEAM

CROSS-REFERENCE TO RELATED APPLICATIONS

This Application is a Section 371 National Stage Application of International Application No. PCT/AU2013/000668, filed Jun. 21, 2013, which is incorporated by reference in its entirety and published as WO 2013/188924 on Dec. 27, 2013, in English.

FIELD

The invention relates to forming conductive portions in insulating materials and to devices including conductive portions in insulating materials.

The invention is described in relation to graphene oxide although various embodiments of the invention may relate to other insulating materials.

BACKGROUND

Graphene is an allotrope of carbon which in its purest form consists of a sheet, or a small number of stacked sheets, of carbon atoms arranged in a hexagonal lattice. Graphene has remarkable material properties, including chemical and mechanical stability, high electron mobility and zero-gap semi-metal characteristics.

Graphene oxide is a variant of graphene which includes carbon atoms arranged in a hexagonal lattice and an additional constituent in the form of oxygenated functional groups in its basal and edge planes. These functionalities while allowing the graphene oxide to solubilize in different solvents including water, decreases the electrical conductivity of graphene oxide to the extent that it becomes insulating. Graphene oxide can be synthesized by oxidative exfoliation of graphite The present inventors consider patterning of graphene oxide and other carbon containing insulating materials to be a potential route to opening bandgaps and for applications in nano-electronics and fabrication of planar micro-super capacitors.

Various reported methods of patterning graphene oxide rely on local thermal reduction to form conducting pathways. One reported method utilizes the heating power of lasers to produce mm scale features. For the purpose of nano-electrics much smaller features are required. Another reported method involves the hot tip of an atomic force microscope to imprint features on the scale of ~15 nm. This method is technically complicated and requires special modification to commercially available apparatus.

Various embodiments of the invention aim to provide improvements in and for the formation of conductive pathways in insulating materials, or at least to provide an alternative for those concerned with conductive pathways in insulating materials.

It is not admitted that any of the information in this patent specification is common general knowledge, or that the person skilled in the art could be reasonably expected to ascertain or understand it, regard it as relevant or combine it in any way at the priority date.

SUMMARY

One aspect of the invention provides a method of forming a conductive portion in an insulating material wherein the insulating material includes carbon and at least one other constituent; and the method includes exposing the insulating material to ions to preferentially remove the other constituent.

The other constituent may be or include oxygen. The insulating material may be graphene oxide, in which case the conductive portion preferably at least predominantly consists of graphene and/or reduced graphene oxide.

Preferably the conductive pathway is less than about 20 nm across.

The exposing to ions preferably includes operating a focused ion beam, which beam preferably has an ion flux substantially in the range of 5 $C/m^2$ to 30 $C/m^2$. The ions may include or consist of one or more of Gallium ions, Phosphorous ions, Arsenic ions and Nitrogen ions. Preferably the ions are Gallium ions.

Preferably the exposing includes applying a voltage substantially in the range of 1 keV to 60 keV, e.g. the voltage may be about 30 keV.

Another aspect of the invention provides a device, e.g. a capacitor, including a conductive portion formed in accordance with the method.

BRIEF DESCRIPTION OF DRAWINGS

FIG. 1$b$ is a perspective view of the graphene oxide sheet exposed to a focused ion beam;

FIG. 1$c$ is a perspective view of the graphene oxide sheet with a conductive portion formed by the focused ion beam;

FIGS. 2$a$ and 2$b$ chart the results of a simulation;

FIG. 2$c$ is scanning electron microscope image of a treated portion of graphene oxide;

FIG. 2$d$ is a chart of EDS test results based on measurements at the locations indicated in FIG. 2$c$;

FIG. 3$a$ is scanning electron microscope image of a treated portion of graphene oxide;

FIGS. 3$b$ and 3$c$ are charts of test results based on the locations indicated in FIG. 3$a$;

FIGS. 4$a$ to 4$c$ are scanning electron microscope images of patterned graphene oxide in accordance with embodiments of the invention;

FIG. 4$a$ shows an edge of a pattern;

FIG. 4$b$ shows an image of the Australian continent;

FIG. 4$c$ show a 15 nm line drawn on a graphene oxide flake; and

FIG. 4$d$ is an optical image of the patterned graphene oxide of FIG. 4$b$ obtained with a reflecting light microscope.

DESCRIPTION OF EMBODIMENTS

To demonstrate an embodiment of the invention, graphite was converted to oxidized Graphene oxide by the modified Hummer's method. Graphene oxide films were deposited on Si substrates (with a 100 nm thermally grown oxide layer) having an inherent electrical conductivity of the order of 10-16 s/m by spin coating.

To expose the graphene oxide films to ions a focused ion beam was directed such that the film was impinged with Ga-ions at relatively low operating voltage and low ion flux. Ion flux ($C/m^2$) can be quantified by the product of beam current, sample area and time of exposure—each parameter can be measured independently during the experiment.

Focused ion beams are an integral part of most modern-day electron microscopy facilities. Also, focused ion beams have previously been used for revealing micro- and nano-structures by spatially selective ablation (in conjunction with scanning electron microscopes), deposition of materials by Chemical Vapor Deposition, mask-less patterning and repair of integrated circuits. Typically, a focused ion beam uses a liquid metal source that is ionized, focused by electromagnetic lenses, and then bombarded on the sample of interest to effectively mill materials.

The effect of ion-bombardment was studied by electrical conductivity measurements on patterns of 100 μm×100 μm size, and supplemented by micro-Raman spectroscopy and Energy Dispersive Spectroscopy (EDS) to confirm the conversion process. Complex structures such as the map of Australia and lines down to 15 nm were written directly by this novel technique.

Without wishing to be bound by any particular theory, it is understood that the Ga ions bombard the surface of the graphene oxide with a significant kinetic energy and are dispersed into the graphene oxide lattice. This energy if large enough will break the covalent bonds between the atoms and sputter away material; however, given the oxygen atoms have a lower surface binding energy or higher volatility than the carbon atoms, they will have a higher probability of sputtered away and this principle provides the basis for the selective and tunable reduction of at least preferred forms of the invention.

Figure 1A:
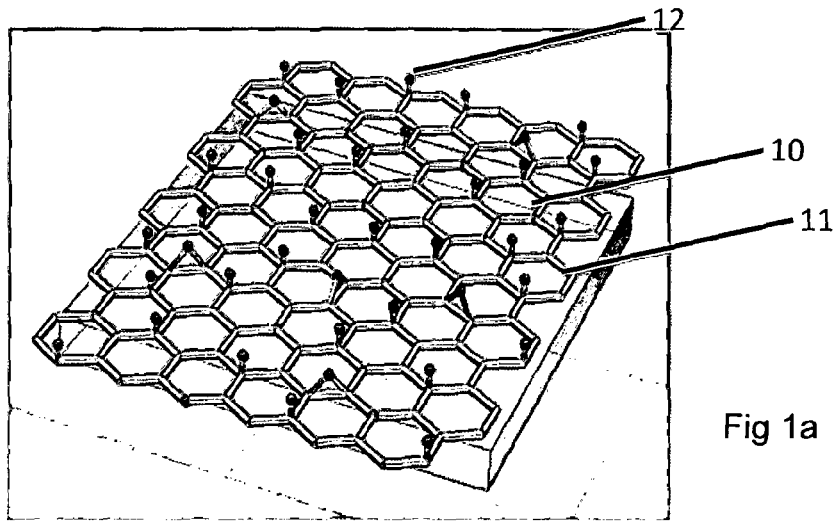
FIG. 1$a$ is a perspective view of an exemplary graphene oxide sheet.
Figure 1B:
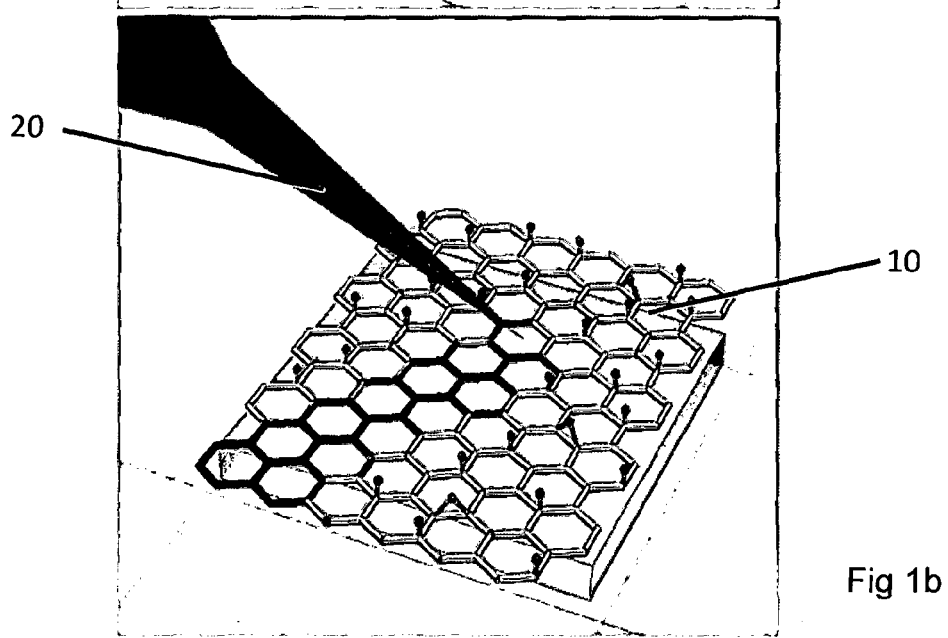
Figure 1C:
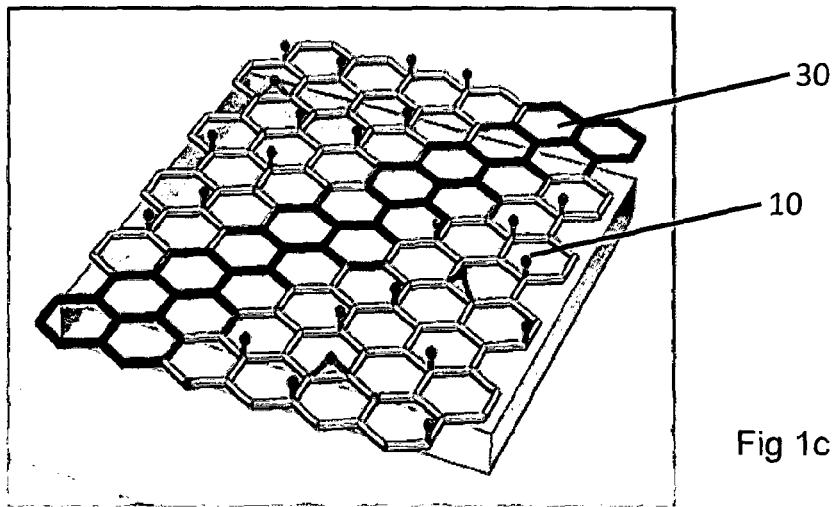

FIGS. 1a to 1c illustrate the sequences of selective patterning of a graphene oxide sheet 10 using the focused ion beam 20. The sheet 10 includes a hexagonal lattice structure 11 of carbon atoms from which oxygenated functional groups 20 depend. A focused ion beam 20 is moved across the sheet 10. The beam 20 has enough energy to break bonds and create a collision cascade such that oxygen is more likely to be sputtered resulting in the reduction of graphene oxide to form a conductive portion 30.

Simulations were conducted to confirm the novel concept of preferential oxygen removal from graphene oxide using the Stopping Range of Ions in Matter (SRIM) freeware. Typically, the incident ions chosen were Ga, the accelerating voltage was varied between 1-60 kV, and the target was composed of three layers. The uppermost was a film of graphene oxide (~3 microns thick) with a carbon to oxygen ratio indicative of the modified Hummers method of 1.8. The next layer was composed of 100 nm of SiO2 and finally the Si base was 1 mm of Si. While standard values for displacement energies of Si and O (15 eV and 20 eV respectively) in the Si and SiO2 lattices were utilized, the binding energy for the graphene oxide layer was determined from an approximate composition of graphene oxide and the strength of the bonds.

For the purpose of the simulation it was assumed that graphene oxide was composed of 66.7% sp3 bonds (bond energy 3.8 eV) and 33.3% were sp2 (bond energy ~7.05 eV). For the carbon to oxygen bonds, it was assumed that hydroxyl (C—OH, bond energy ~3.73 eV) groups made up 36.6%, epoxies (C—O—C, bond energy ~3.82 eV) were about 53.3% and remaining 10% being carbonyl groups (C═O, bond energy ~7.67 eV). It is apparent that in a graphene oxide system, the sp2 C atoms and the C═O bonds are the strongest and most difficult to be disrupted. Given the bond-breaking process is probabilistic and depends on the relative amounts of each material and their bond strength, it was estimated that mean effective bond strength of the C—O bonds is ~4.17 eV whereas the C—C bond energy is ~4.90 eV.

While the bond energies indicate the propensity of bonds to be broken, whether or not the atom is actually sputtered, is to a large extent determined by the surface binding energy. Only if an atom at the surface has a kinetic energy greater than that of the surface binding energy is it able to leave the solid. Exact numerical values of the surface binding energy for most materials is difficult to obtain; however the physically analogous, heat of sublimation, is thought to be a reasonable approximation for analyzing a sputtering process.

Most importantly for the present case, carbon and oxygen have significantly different heats of sublimation: carbon ~7.5 eV and oxygen ~2 eV. In the simulation, the composite target was then bombarded with 3000 Ga ions at different operating voltage and the composition of the sputtered species recorded. The simulated results of sputtering are plotted in FIG. 2(a). They show the Ga ions, at a beam energy of 30 keV, incident on a film of graphene oxide preferentially removes oxygen over carbon at a ratio of 5 oxygen atoms for every 2 carbon atoms. There is a relative error of ±2% in the simulations.

FIG. 2b is a snapshot of the displacements caused by 30 keV Ga ions in a graphene oxide film of 1 micron depth— the majority of the ions reach only a depth of 30 nm.

Whilst the simulations are thought to be accurate only to the extent of suggesting trends, they predict that the oxygen atoms are more likely to be sputtered than carbon from graphene oxide. The simulations also suggest that this preferential removal is particularly effective at lower energies of the incident ion beams. Most importantly, even at 30 keV—a standard FIB operating energy of Ga ions, the simulations indicate a preferential removal of 5 oxygen atoms for every 2 carbon atoms.

For generating direct experimental evidences, samples of graphene oxide films and flakes were prepared and irradiated with beams of 30 keV Ga ions having an effective flux between 4.6 to 27.4 C/m$^2$ with a current varying between 93 pA to 2.1 nA and exposure times between 10 to 120 sec.

The exposed region was then investigated with Energy Dispersive Spectroscopy and compared to the unexposed region (see FIG. 2 (c) & (d)). The experimental EDS results shown in FIG. 2d illustrate a decrease of oxygen content in a 0.8 μm thick graphene oxide film post-exposure to the ion beam. The atomic C/O ratio changed from 1.8±0.1 to 2.9±0.1.

Areas of graphene oxide films unexposed to ion beams had a carbon content of 64±2 and an oxygen content of 36±2%. This changed to 74.5±2.5% for carbon and 25.5±2.5% for oxygen in the exposed regions clearly demonstrating deoxygenation. The C/O ratio in the exposed sample is similar to that reported for the reduction of graphene oxide via hydrazine reduction.

During exposure to ion-beams, the kinetic energy of the energetic ions can lead to heating effects, however, it is unlikely that the observed deoxygenation is affected by thermal loading as the estimated change in temperature relevant to our experimental conditions is ~0.002° C., which cannot initiate the reduction process.

To ascertain this ion-beam assisted conversion process, electrical conductivity measurements on areas impinged with varying dose of ion flux were performed (see FIG. 3). Instead of graphene oxide flakes, which may not form continuous films, relatively thick graphene oxide films and large patterns were utilized for direct measurements without any lithographically-defined electrical pads. Typically the patterns were 100×100 μm with a thickness of 1 μm and electrodes were placed 50 μm apart inside the pattern using micro-manipulators.

As shown in FIG. 3b the Raman spectra (obtained from a 632.8 nm laser operating at 10% power) of the sample material post exposure to ion-beams (27.9 C/m$^2$) indicate an increase in the ID/IG ratio and shift of the G-peak. These results are analogous to spectral changes observed during chemical reduction of graphene oxide.

As shown in FIG. 3c the conductivity of the patterns increases with increasing ion-flux:
  untreated synthesized graphene oxide has a conductivity below the detection limit of the inventors' equipment and appears as a horizontal line if FIG. 3c;
  ion flux 27.9 C/m$^2$—conductivity 4.0±0.2×10$^{-2}$ s/m;
  ion flux 13.95 C/m$^2$—conductivity 2.0±0.5×10$^{-2}$ s/m;
  ion flux 4.65 C/m$^2$—conductivity 0.46±0.01×10$^{-2}$ s/m.

The areas exposed to the ion beam demonstrated an increase in conductivity in comparison to the unexposed graphene oxide and the conductivity increases with increased dosage of ion-flux (within ~4.6 to 28 C/m$^2$ of flux). The inventors also noticed that under these conditions of conversion, the content of Ga implantation was below the detection limit of their instrument operating at 15 kV. Only when the ion flux was increased to around 60 C/m$^2$, i.e. twice the maximum value of ion-beam assisted conversion experiments, were the inventors able to detect the first traces of Ga indicating that the increase in conductivity arises from the large change in the concentration of oxygen in the films. Further increase in ion-flux to ~300 C/m$^2$ led to conventional milling of the sample.

For the sake of comparison, the highest conductivity of 4.0±0.2×10$^{-2}$ s/m in these patterns are significantly larger than the reported conductivity of graphene oxide (~10$^{-5}$-10$^{-3}$ s/m). In these experiments, the conductivity of graphene oxide was below the detection limit of the inventors' instrument. Given this instrument is capable of measuring currents in the order of pA, the conductivity of the heavily oxidized graphene oxide sheets is likely to be of the order of 10$^{-5}$ s/m indicating an increase by about 3 decades in the exposed regions. However, by no means is this conversion complete as it is still 2 to 3 orders of magnitude lower than previous reports for reduced graphene oxide via chemical and thermal methods.

This conversion is likely limited to the surface of the graphene films, as the simulations indicate that Ga-ions at 30 keV only penetrate to a depth of 30 nm, i.e. ~3.75% of a 0.8 µm thick graphene oxide film. Additionally the majority of the incident ions may lose energy upon the first initial contact with the substrate and each subsequent collision has less energy available. While this would mean that the thickness of the current-carrying layers measured by profilometry will be an overestimate and the conductivity values reported here is an underestimation of the actual values, it may also suggest that the focused ion beam induced conversion, unlike chemical or thermal techniques, can be utilized for surface-conversion of relatively thick graphene oxide films.

The focused ion beam induced conversion is also supported by changes in the Raman spectra where the ratio of the D to G peak increases upon irradiation (from 1 to 1.11) and the G peak shifted from 1594 cm$^{-1}$ to 1588 cm$^{-1}$ as shown in FIG. 3(b). The changes are consistent with chemically reduced graphene oxide.

The inventors believe (i) the decrease in oxygen concentration, (ii) the increase in electrical conductivity, and (iii) the change in Raman spectra is consistent with chemically reduced graphene and so evidences spatially-selective reduction of graphene oxide by controlled-dose of focused ion beams.

Given the relatively low energy levels required to form the conductive patterns, the higher resolution scanning electron microscope images even display folds in graphene sheets that extend from the unexposed to the exposed regions with only a change in contrast as shown in FIG. 4(a). Previous discussion of the Raman spectroscopy corroborates the observation of minimal damage to the graphene sheets; i.e. the underlying structure of the untreated material (which is a hexagonal carbon lattice in the case of graphene oxide) in substance remains after treatment.

The simulations suggest a preferential removal of oxygen over carbon yet never indicate that carbon is not sputtered. Therefore, it is rather intriguing that graphene oxide retains the sheet-like structure and does not undergo amorphization. It remains to be shown whether the underlying structure of graphene oxide sheets is unaffected by the exposure to ions or whether the carbon recrystallizes into graphene lattices during the exposure to ions.

A least preferred forms of the invention may be applied to pattern complex shapes—an example of which is the map of Australia (FIG. 4(b)). Given the ability to focus ion beams to spot sizes as small as 5 nm, fabrication of nanoscale features are feasible. Demonstrated here are lines as small as 15 nm. While the size of the focused beams can be as small as 5 nm, the feature size is limited by the interactions of the ion and the substrate. Upon impact the ions are distributed by a random process that can be described by a Gaussian distribution leading to an increase in feature size almost three times the beam radius, as seen in FIG. 4(c). The patterns fabricated with the focused ion beams and imaged with a scanning electron microscope can also be viewed in reflected light microscopes as seen in FIG. 4(d).

FIG. 4a shows an edge of a pattern formed graphene oxide. Features crossing the sharp boundary of exposed and unexposed regions can be seen. The features are structurally intact, with the changes limited to the contrast.

In summary the disclosed exemplary method is a method for localized deoxygenation of graphene oxide and direct writing of structures in the length scale of 10's of nm to 100's of microns by exposure to ions. It is also contemplated that the disclosed method may be extended to removing other constituents and to other insulating materials. At least preferred forms of this novel FIB-induced conversion technique may be harnessed for direct imprinting of complex micron-scale shapes and sub-20 nm lines of reduced graphene oxide in insulating films and flakes of graphene oxide establishing the capability for generating features across ~100's of µm to ~10's nm length-scales in a mask-less and efficient manner.

The ability to pattern Graphene oxide with complex, conductive patterns by focused ion beams—a tool which is readily available with most micro/nanofabrication facilities, opens up the possibility of maskless fabrication of microcircuits in graphene electronics.

At least preferred forms of the invention could be a potential tool for fabrication of structures to explore quantum effects and to produce energy storage devices (e.g. nanoscale capacitors) and other electronics.

Experimentation suggests that certain capacitors of the present disclosure, incorporating carbon based supercapacitor electrodes with planar geometry, will be the smallest and thinnest known supercapacitor devices with the highest capacitance ever reported. Experiments suggest the capacitance, which is directly proportional to the energy density, of these supercapacitor electrodes is four orders of magnitude (i.e. 10000 times) higher than the best capacitance ever reported in the literature for carbon based materials.

A comparison of the experimentally obtained capacitance values of the GO, FIBRGO and laser reduced GO planar electrodes are shown in Table 1. The laser reduced RGO capacitance is approximately similar to the reported capacitance of carbon based planar electrodes. The capacitance of the FIBRGO is about 5 and 4 orders of magnitude higher than the GO and laser reduced GO planar electrodes respectively. The capacitance value of the FIBRGO electrode is by far the highest capacitance ever reported for carbon based planar electrodes. It is about 4 orders of magnitude higher than the best capacitance value reported in the open literature for these types of electrodes.

TABLE 1

Capacitance values of the GO, FIBRGO and laser reduced GO planar electrodes in 1M $Na_2SO_4$

| Planar electrode | Capacitance (F/cm$^2$) |
| --- | --- |
| GO | $1.77 \times 10^{-5}$ |
| FIBRGO | 1.26 |
| Laser reduced GO | $1.09 \times 10^{-4}$ |

The invention claimed is:

1. A method comprising:
providing an insulating material, wherein the insulating material includes carbon and at least one other constituent; and
forming a conductive portion in the insulating material by exposing the insulating material to ions of a beam to preferentially remove the other constituent.

2. The method of claim 1, wherein the other constituent is or includes oxygen.

3. The method of claim 2, wherein the insulating material is graphene oxide.

4. The method of claim 3, wherein the conductive portion at least predominantly consists of at least one of graphene or reduced graphene oxide.

5. The method of claim 1, wherein the conductive portion is less than about 20 nm across.

6. The method of claim 1, wherein the method comprises producing a capacitor, including the forming of the conductive portion in the insulating material.

7. The method of claim 1 wherein the beam has an ion flux substantially in the range of 5 C/m$^2$ to 30 C/m$^2$.

8. The method of claim 1, wherein the ions include one or more of Gallium ions, Phosphorous ions, Arsenic ions or Nitrogen ions.

9. The method of claim 1, wherein the ions are Gallium ions.

10. The method of claim 1, wherein the exposing includes applying a voltage substantially in the range of 1 keV to 60 keV.

11. The method of claim 1, wherein the exposing includes applying a voltage of about 30 keV.

12. A device including a conductive portion formed in accordance with claim 1.

13. The device of claim 12 being a capacitor.

14. The method of claim 1, wherein the exposing to ions includes operating a focused ion beam.

15. The method of claim 14, wherein the beam has an ion flux substantially in the range of 5 C/m$^2$ to 30 C/m$^2$.

16. The method of claim 14, wherein the method comprises producing a capacitor, including the forming of the conductive portion in the insulating material.

17. The method of claim 14 wherein the insulating material is gaphene oxide and the conductive portion at least predominantly consists of at least one of graphene or reduced graphene oxide.

18. The method of claim 14 wherein the ions include one or more of Gallium ions, Phosphorous ions, Arsenic ions or Nitrogen ions.

19. The method of claim 14 wherein the ions are Gallium ions.

20. The method of claim 14 wherein the exposing includes applying a voltage substantially in the range of 1 keV to 60 keV.

21. A device including a conductive portion formed in accordance with claim 14.

22. The device of claim 21 being a capacitor.

* * * * *

UNITED STATES PATENT AND TRADEMARK OFFICE
CERTIFICATE OF CORRECTION

PATENT NO. : 9,558,887 B2
APPLICATION NO. : 14/408899
DATED : January 31, 2017
INVENTOR(S) : Majumder et al.

It is certified that error appears in the above-identified patent and that said Letters Patent is hereby corrected as shown below:

On the Title Page

Item (54) and in the Specification, Column 1, Line 1 reads:
"FORMING CONDUCTIVE PORTIONS IN INSULATING MATERIALS MATREIALS USING AN ION BEAM"

Should read:
--FORMING CONDUCTIVE PORTIONS IN INSULATING MATERIALS USING AN ION BEAM--.

Signed and Sealed this
Second Day of May, 2017

Michelle K. Lee
*Director of the United States Patent and Trademark Office*